United States Patent [19]
Lee et al.

[11] Patent Number: 5,223,753
[45] Date of Patent: Jun. 29, 1993

[54] SLEW RATE SPEED-UP CIRCUIT

[75] Inventors: Bang-Won Lee, Kwangmyeong; Kyoung-Un Hwang, Incheon, both of Rep. of Korea

[73] Assignee: SamSung Electronics Co., Ltd., Suwon, Rep. of Korea

[21] Appl. No.: 755,869

[22] Filed: Sep. 6, 1991

[30] Foreign Application Priority Data

Jul. 26, 1991 [KR] Rep. of Korea ............... 1991-12922

[51] Int. Cl.$^5$ ............................................. H03K 5/22
[52] U.S. Cl. .................................... 307/494; 307/355
[58] Field of Search ................. 307/355, 263, 491, 494

[56] References Cited

U.S. PATENT DOCUMENTS

| | | | |
|---|---|---|---|
| 4,464,588 | 8/1984 | Wieser | 307/491 |
| 4,614,882 | 9/1986 | Parker et al. | 307/494 |
| 4,636,665 | 1/1987 | McLaughlin | 307/355 |
| 4,906,871 | 3/1990 | Iida | 307/542 |

Primary Examiner—Jin F. Ng
Assistant Examiner—Sinh Tran
Attorney, Agent, or Firm—Robert E. Bushnell

[57] ABSTRACT

In an operational amplifier or a comparator, a slew rate speed-up circuit improving the slew rate, without added power consumption, is disclosed. In a preferred embodiment, an operational amplifier, having one differential amplifier and a first pull-up transistor 10 having a gate connected to an output terminal 23 of the differential amplifier, includes a first output terminal 25, a second pull-up transistor 9 having a gate connected to the output terminal 23 of the differential amplifier and having a channel connected between a power supply voltage terminal and the first output terminal, a second output terminal 26 connected to one end of the channel of the first pull-up transistor 10, a current regulating means 30, connected between the first output terminal and the second output terminal, having one common current path, one pull-up current path and one pull-down current path, a first pull-down transistor 11 having a channel connected between the second output terminal and a ground voltage terminal, and a second pull-down transistor 8 having a channel connected between the first output terminal and the ground voltage terminal.

21 Claims, 2 Drawing Sheets

5,223,753

SLEW RATE SPEED-UP CIRCUIT

BACKGROUND OF THE INVENTION

The present invention relates to an operational amplifier or a comparator, and more particularly to a circuit which can improve the slew rate (the response speed of an output signal as a function of an input signal) of the operational amplifier having a capacitive load at an output terminal.

Most electronic circuits use an operational amplifier or the comparator which produces an output signal, by summing, subtracting or differential amplifying input signals of an invert terminal and a non-inverted terminal. In such an operational amplifier, the response of the output signal as a function of an input signal is important to the performance and reliability of the electronic circuit. Specially, if a comparator used in a semiconductor memory device has a slow response speed, the malfunction of the memory device operating at a high speed as well as a slow data access time will result.

FIG. 1 is a circuit diagram illustrating a comparator (or an operational amplifier) of the prior art. As shown in FIG. 1, it will be appreciated that the comparator and the differential amplifier of an N-channel input type are the same in construction. Therefore, when the potential of a first input terminal 21 is higher than that of a second input terminal 22, P type MOS transistors 4 and 5 and N type MOS transistors 7 and 11 are turned on to drop the potential of a second output terminal 24. If the potential of the second input terminal 22 is higher the first input terminal 21, a power supply voltage $V_{DD}$ is charged on the second output terminal 24 through a P type MOS transistor 10. In this case, the voltage gain $A_{VO1}$ of a first output terminal 23 and the voltage gain $A_{VO2}$ of the second output terminal 24 are calculated respectively as follows.

$$A_{VO1} = gm_2/gm_6$$

$$A_{VO2} = \{gm_1 (S_{10}/S_6)\}/(gds_{10} + gds_{11})$$

Wherein $gm_1$, $gm_2$ and $gm_6$ are the transconductance of N type MOS transistors 1 and 2 and P type MOS transistor 6, respectively, gds the channel conductance, S the ratio of the width of channel to the length thereof.

In case that the output voltage $V_{OUT}$ is increased, the slew rate SR at the second output terminal 24 becomes maximum value when the pull-down current $I_{11}$ flowing into a ground voltage terminal $V_{SS}$ from the second output terminal 24, through the N type MOS transistor 11, is "0". In case that the output voltage is decreased, the slew rate SR at the second output terminal 24 becomes maximum value when the pull-up current $I_{10}$ flowing into the second output terminal 24 from the power supply voltage terminal $V_{DD}$, through the P type MOS transistor 10, is "0".

However, at the second output terminal 24, there exists the load capacitance $C_L$ resulting from parasitic capacitor 15, which makes the load current $i_L$ flow. The load capacitance $C_L$ and the load current $i_L$ have an important effect on the slew rate SR during the potential of the second output terminal 24 is changed from logic "LOW" to logic "HIGH" or from logic "HIGH" to logic "LOW". In detail, the slew rate SR is defined as the differential coefficient of the output voltage $V_{out}$ with respect to time, and on the other hand the load current $i_L$ indicates the value the pull-down current $I_{11}$ from the pull-up current $I_{10}$. Thus, the slew rate SR can be expressed as follows.

$$SR = |dV_{out}/dt| = |i_L/C_L| = |(I_{10} - I_{11})/C_L|$$

As shown in the above expression concerning the slew rate SR, in order to increase the slew rate SR (or to have fast response speed of an output signal as a function of an input signal), the load capacitance $C_L$ should be decreased or the load current $i_L$ should be increased. The value of the load capacitance $C_L$ can not be changed because the load capacitance, as a parasitic element, has a inevitably fixed value in a circuit construction, but it is possible to increase the load current $i_L$ by increasing the size of P type MOS transistor 10 and N type MOS transistor 11. However, to increase the size of MOS transistors 10 and 11 for use in output results undesirably in the increase of power consumption of the circuit.

It is therefore an object of the invention to provide a circuit capable of improving a slew rate without increasing power consumption of an output terminal in a comparator.

In accordance with an aspect of the present invention, an operational amplifier, having one differential amplifier and a first pull-up transistor with a gate connected to the output terminal of the differential amplifier, includes a first output terminal, a second pull-up transistor with a gate connected to the output terminal of the differential amplifier and with a channel connected between a power supply voltage terminal and the first output terminal, a second output terminal connected to either one terminal of the channel of the first pull-up transistor, a current regulating means connected between the first output terminal and the second output terminal and having one common current path, one pull-up current path and one pull-down current path, a first pull-down transistor with a channel connected between the second output terminal and a ground voltage terminal, and a second pull-down transistor with a channel connected between the first output terminal and a ground voltage terminal.

BRIEF DESCRIPTION OF THE DRAWINGS

The advantages and features of the present invention will be more apparent from the detailed description hereunder, taken in conjunction with the accompanying drawings wherein.

DETAILED DESCRIPTION OF THE PREFERRED EMBODIMENTS

Figure 1:
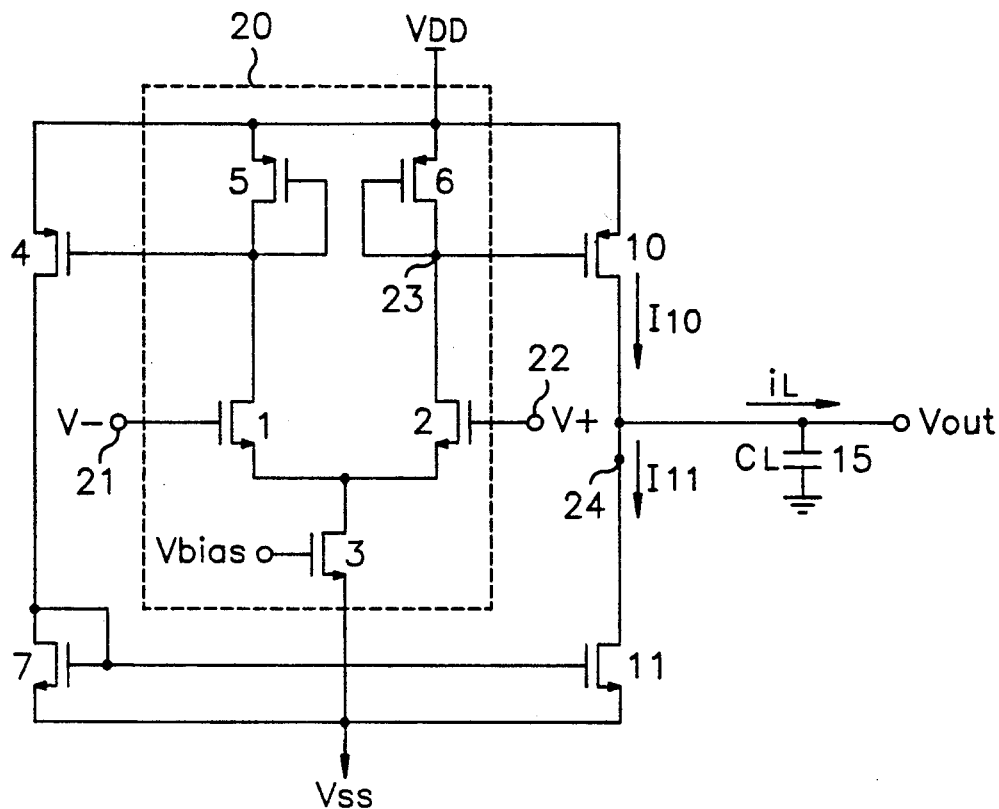
FIG. 1 shows a circuit diagram of a comparator (or an operational amplifier) of a prior art.
Figure 2:
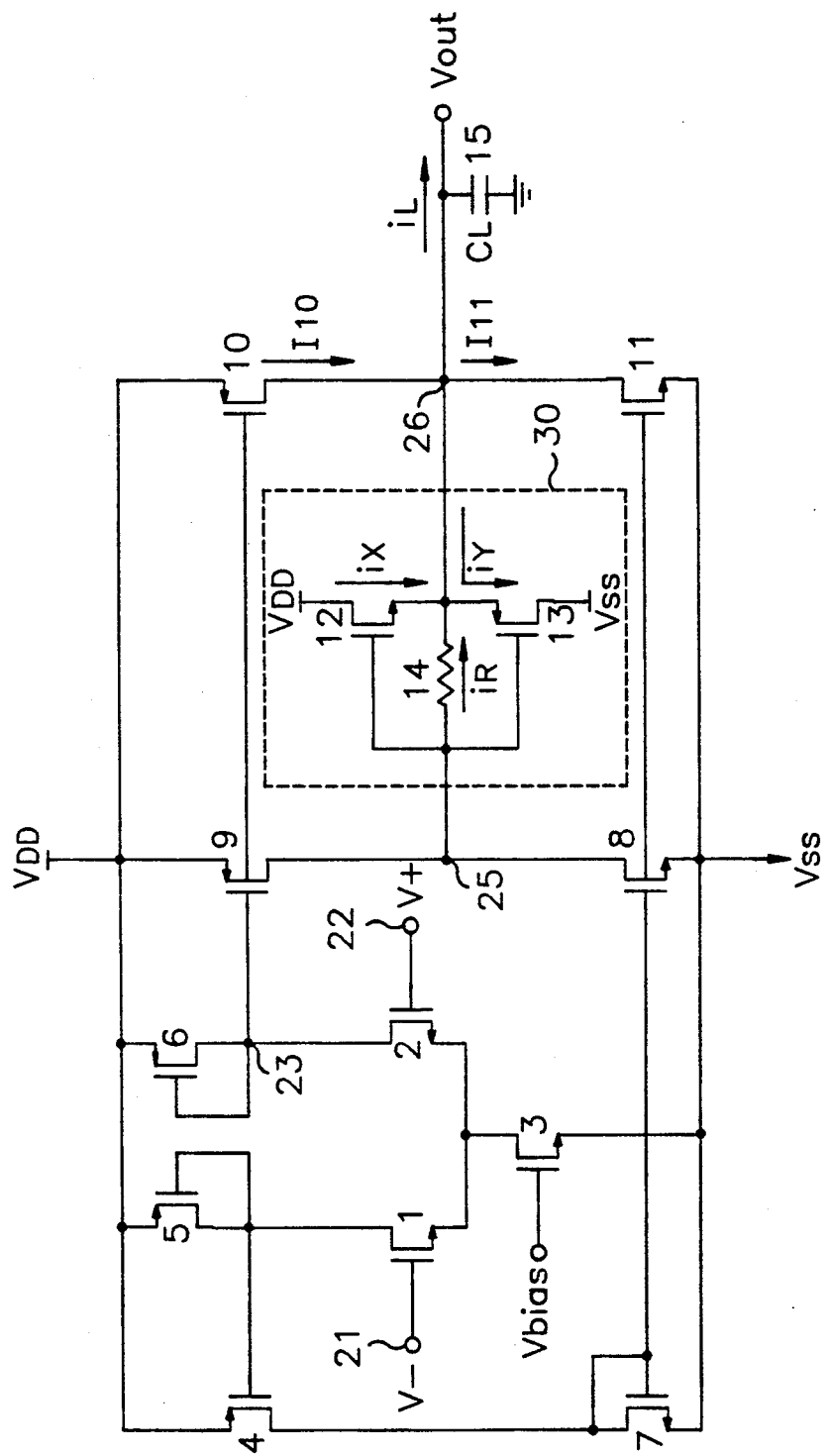
FIG. 2 shows a circuit diagram illustrating the preferred embodiment of a comparator (or an operational amplifier) according to the present invention.

In FIG. 2, the same structural elements as those shown in FIG. 1 are designated by like reference numerals. As shown, a gate of a P type MOS transistor 9 is connected to an output terminal 23 of a differential amplifier, and a channel thereof is connected between a power supply terminal $V_{DD}$ and a first output terminal 25. An N type MOS transistor 8 has a gate connected to a gate of an N type MOS transistor 7, and a channel connected between the first output terminal 25 and a ground voltage terminal $V_{SS}$. A current regulating circuit 30, comprised of an N type MOS transistor 12, a P type MOS transistor 13 and a resistor 14, is connected between the first output terminal 25 and a second output terminal 26, the second output state 26 corresponding to the second output terminal 24 of FIG. 1. The gate of the N type MOS transistor 12 is connected to the first output terminal 25, and a channel thereof is connected between the power supply voltage $V_{DD}$ and the second output terminal 26. A gate of the P type MOS transistor 13 is connected to the first output terminal 25, and a channel thereof is connected between the second output terminal 26 and the ground voltage terminal $V_{SS}$. The resistor 14 connects the first output terminal 25 to the second output terminal 26. In the circuit as shown in FIG. 2, it should be noticed that the P type MOS transistors 9 and 10 for use in pull-up are equal in size, and the N type MOS transistors 8 and 11 for use in pull-down are also equal in size.

Figure 3:
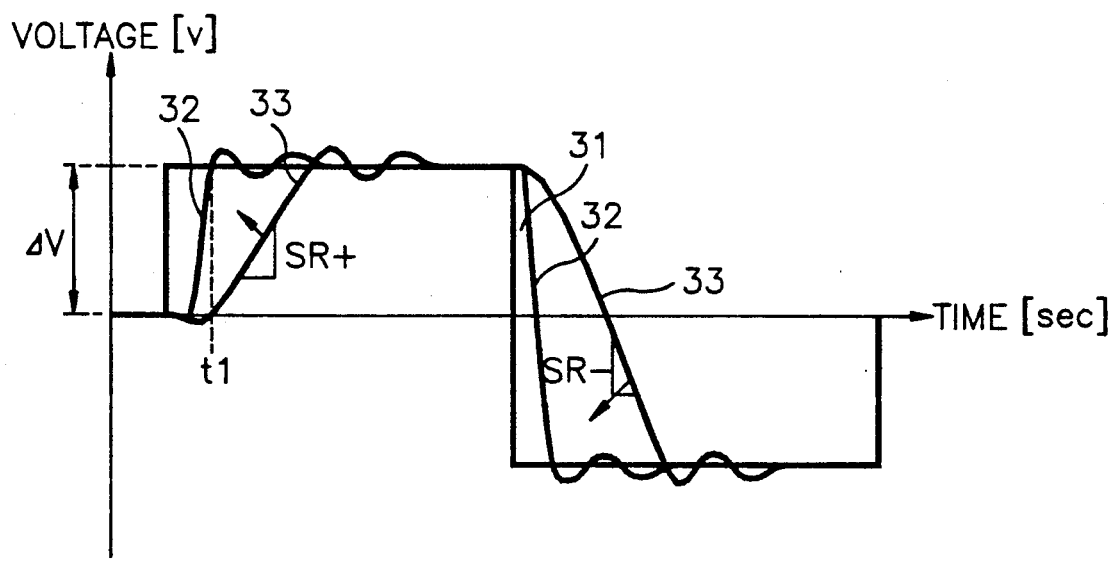
FIG. 3 shows a view illustrating the operational waveform according to the present invention.

In FIG. 3, an input waveform 31, a waveform 32 at the first output terminal 25 and a waveform 33 at the second output terminal 26 are shown. It is assumed that an input signal, referred to as "a first input signal", of logic low i.e., "0" level is applied to the first input terminal 21, and a signal, referred to as "a second input signal", such as the input waveform 31 of FIG. 3 is applied to the second input terminal 22. Since the potential of the second input signal is higher than that of the first input signal, the potential of the output terminal 23 of the differential amplifier comes to logic low. Thereby, the P type MOS transistors 9 and 10 for use in pull-up are turned on, thus charging the first output terminal 25 and the second output terminal 26 up to the power supply voltage $V_{DD}$ level. In this case, if there is no capacitor 15 at the second output terminal 26, the voltage of the first output terminal 25 and the second output terminal 26 becomes identical to each other and then the current does not flow between the first output terminal 25 and the second output terminal 26. However, as described above, it is unavoidable that the load capacitance $C_L$ caused by the parasitic capacitor 15 at the second output terminal 26 exist. Therefore, at the first output terminal 25, by the load capacitance $C_L$, the voltage such as the waveform 32 of FIG. 3 is formed, and at the second output terminal 26, the voltage such as the waveform 33 of FIG. 3 is formed. The waveform 33 of the second output terminal 26 has a more gentle gradient, i.e., a more gentle slew rate than that 32 of the first output terminal. This is because of the charging time of the load capacitance $C_L$. That is, the potential of the first output terminal 25 is higher than that of the second output terminal 26 as much as $\Delta V$ at time t1. If the potential difference $\Delta V$ becomes greater than the threshold voltage of the N type MOS transistor 12, the N type MOS transistor 12 is turned on and then current $i_x$ flows into the second output terminal 26 until the potential of the first and second output terminals 25 and 26 become identical. Furthermore, the current $i_R$, caused by the potential difference between the first output terminal 25 and the second output terminal 26 at the resistor 14, flows into the second output terminal 26. That is, the amount of the current flowing into the second output terminal 26 becomes $(I_{10}-I_{11})+i_x+i_R$. This amount of current flowing into the second output terminal 26 is increased as much as $(i_x+i_R)$, in comparison with that of FIG. 1. As a result of the increase of output current, the charging time of the capacitor 15 is shorter, thereby improving the slew rate. In the same way, if the potential of the second input signal is lower than that of the first input signal which is logic "0" level, the current flowing into the ground voltage terminal $V_{SS}$ becomes the sum of the current $i_y$ flowing through the P type MOS transistor 13, the current flowing into the first output terminal 25 through the resistor 14, the direction thereof being opposite to the direction of the above current $i_R$, and the pull-down current $i_{11}$. Wherein a current direction flowing into the first output terminal 25 through the resistor 14 is determined in dependence on a potential difference between the first output terminal 25 and the second output terminal 26. Accordingly, the discharging time of the load capacitance $C_L$ becomes shorter as that much, thus improving the slew rate.

Consequently, since the waveform 33 of the second output terminal 26 is shifted in the direction of an arrow, the response speed (or the slew rate) of an output signal as a function of the input waveform 31 becomes faster.

As described above, in an operational amplifier or a comparator, the slew rate of the output signal can be improved without increasing a power consumption in stand-by of a circuit.

The present invention has been particularly shown and described with reference to a preferred embodiment employing the comparator of an N-channel input type. However, even if the comparator of a P-channel input type is used, or even if a signal such as an input waveform 31 of FIG. 3 is used as a first input signal with setting a second input signal of logic "0" level, it will be understood by those skilled in art that the operation and aim achieved by the described preferred embodiment can be performed.

What is claimed is:

1. A circuit for improving a response speed of an output signal with respect to an input signal of an operational amplifier having a differential amplifier and having a first pull-up transistor with a gate connected to an output terminal of said differential amplifier, said circuit comprising:

a first output terminal connected to a terminal of a channel of said first pull-up transistor;

a first pull-down transistor having a channel connected between said first output terminal and a ground voltage terminal;

a second pull-up transistor having a gate connected to said output terminal of said differential amplifier and a first terminal of a channel thereof connected to a power supply voltage terminal;

a second pull-down transistor connected between said ground voltage terminal and a second terminal of said channel of said second pull-up transistor;

a second output terminal at a junction between said second terminal of said channel of said second pull-up transistor and said second pull-down transistor; and current regulating means directly connected between said first output terminal and said second output terminal, for regulating currents between said first and second output terminals.

2. The circuit as claimed in claim 1, wherein a current direction between said first and second output terminals is determined in dependence upon a potential difference between said first output terminal and said second output terminal.

3. The circuit as claimed in claim 1, wherein said current regulating means is comprised of a first metaloxide-semiconductor transistor having a gate connected to said first output terminal, and a channel connected between said power supply voltage terminal and said second output terminal.

4. The circuit as claimed in claim 3, wherein said current regulating means is further comprised of a second metal-oxide-semiconductor transistor having a gate connected to said first output terminal, and a channel connected between a ground voltage terminal and said second output terminal.

5. The circuit as claimed in claim 4, wherein said current regulating means is still further comprised of a resistor connected between said first output terminal and said second output terminal.

6. The circuit as claimed in claim 4, wherein a conductive type of said first and second pull-up transistors and said second metal-oxide-semiconductor transistor is opposite to said first and second pull-down transistors and said first metal-oxide-semiconductor transistor.

7. The circuit as claimed in claim 1, wherein said current regulating means comprises:
   a N-MOS transistor having a first electrode of a principal electrically conducting channel coupled to said power supply voltage terminal and a second electrode of a principal electrically conducting channel coupled to said second output terminal;
   a P-MOS transistor having a first electrode of a principal electrically conducting channel coupled to said second output terminal and a second electrode of a principal electrically conducting channel coupled to said ground voltage terminal;
   a resistor interposed between said first output terminal and said second output terminal; and
   control electrodes of said N-MOS transistor and said P-MOS transistor coupled to said first output terminal.

8. The circuit as claimed in claim 7, further comprised a capacitor coupled to said second output terminal for discharging the currents flowed between said first and second output terminals.

9. The circuit as claimed in claim 1, wherein said first and second pull-up transistors are of P-MOS transistors, and said first and second pull-down transistors are of N-MOS transistors.

10. A circuit for improving a response speed of an output signal with respect to an input signal of an operating amplifier having a differential amplifier, said circuit comprising:
    a first output terminal;
    a second output terminal;
    a first pull-up transistor having a gate coupled to an output terminal of said differential amplifier and a channel connected between a power supply voltage terminal and said first output terminal;
    a second pull-up transistors having a gate coupled to said output terminal of said differential amplifier and a channel connected between said power supply voltage terminal and said second output terminal;
    a first pull-down transistor having a channel connected between said first output terminal and a ground voltage terminal;
    a second pull-down transistor having a channel connected between said second output terminal and said ground voltage terminal;
    a third pull-up transistor having a gate coupled to said first output terminal and having a channel connected between said power supply voltage terminal and said second output terminal;
    a third pull-up transistor having a gate coupled to said first output terminal and having a channel connected between said ground voltage terminal and said second output terminal; and
    resistive means connected between said first output terminal and said second output terminal.

11. The circuit as claimed in claim 10, wherein a conductive type of said first and second pull-up transistors and said third pull-down transistor is the opposite of said first and second pull-down transistors and said third pull-up transistor.

12. An amplifier circuit for a semiconductor memory device, comprising:
    differential amplifier means for generating difference signals being a function of differences between first input signals and second input signals received at a first input port and a second input port, respectively;
    a first pull-up transistor having a gate coupled to receive said difference signals and a channel connected between a power voltage node and a first output node;
    a first pull-down transistor having a channel connected between said first output node and a ground voltage node;
    a second pull-up transistor having a gate coupled to receive said difference signals and a channel connected between said power voltage node and a second output node;
    a second pull-down transistor having a channel connected between said ground voltage node and said second output node; and
    slew rate means, connected between said first output node and said second output node, for increasing a slew rate of said amplifier circuit.

13. The circuit as claimed in claim 12, wherein said slew rate means comprises a channel of a metal-oxide-semiconductor transistor having a gate connected to said first output node, said channel of said metal-oxide-semiconductor transistor being connected between said ground voltage node and said second output node.

14. The circuit as claimed in claim 12, wherein said slew rate means comprises:
    a common current path between said first output node and said second output node;
    a pull-up current path between said power voltage node and said second output node; and
    a pull-down current path between said ground voltage node and said second output node.

15. The circuit as claimed in claim 14, wherein said common current path is a resistive path between said first output node and said second output node, said pull-up current path is a channel of a third pull-up transistor having a gate connected to said first output node, and said pull-down current path is a channel of a third pull-down transistor having a gate coupled to said first output node.

16. The circuit as claimed in claim 15, wherein a conductive type of said first pull-up transistor, said second pull-up transistor, and said third pull-down transistor is opposite to a conductivity type of said first pull-down transistor, said second pull-down transistor, and said third pull-up transistor.

17. The circuit as claimed in claim 12, wherein said slew rate means comprises:

a N-MOS transistor having a first electrode of a principal electrically conducting channel coupled to said power voltage node and a second electrode of a principal electrically conducting channel coupled to said second output node;

a P-MOS transistor having a first electrode of a principal electrically conducting channel coupled to said second output node and a second electrode of a principal electrically conducting channel coupled to said ground voltage node;

a resistor interposed between said first output terminal and said second output terminal; and control electrodes of said N-MOS transistor and said P-MOS transistor coupled to said first output node.

18. The circuit as claimed in claim 17, further comprised a capacitor coupled to said second output node for discharging the currents flowed between said first and second output terminals.

19. The circuit as claimed in claim 18, wherein said first and second pull-up transistors are of P-MOS transistors, and said first and second pull-down transistors are of N-MOS transistors.

20. In an operational amplifier having a differential amplifier coupled to respectively receive first and second input signals, a first pull-up transistor with a gate coupled to receive an output of said differential amplifier and a channel interposed between a power voltage and a first output terminal, a second pull-up transistor with a gate coupled to receive the output of said differential amplifier and a channel interposed between the power voltage and a second output terminal, and a first pull-down transistor with a channel interposed between the first output terminal and ground, and a second pull-down transistor with a channel interposed between the second output terminal and ground, a process for improving a slew rate indicative of a response speed of an output signal from the first output terminal via the second output terminal as a function of said first and second input signals received by said differential amplifier by the steps of:

providing the output signal from said first output terminal to a gate of a N-MOS transistor having a channel interposed between said power voltage and said second output terminal to enable generation of a current flowing across the first and second output terminals for equalizing the potential between the first and second output terminals in dependence upon a determination of whether the potential of said first output terminal is greater than the potential of said second output terminal to shorten a charging time of said operational amplifier; and providing the output signal from said first output terminal to a gate of a P-MOS transistor having a channel interposed between said second output terminal and ground to enable said operational amplifier to ground the current flowing across the first and second output terminals in dependence upon a determination of whether the potential of said first signal is greater than the potential of said second input signal to shorten a discharging time of said operational amplifier, wherein the generation and the grounding of the current flowing across the first and second output terminals improves the slew rate of the output signal at said second output terminal.

21. An amplifier circuit for a semiconductor memory device, comprising:

differential amplifier means for generating difference signals being a function of differences between first input signals and second input signals received at a first input and a second input, respectively;

a first pull-up transistor having a first pull-up transistor gate receiving said difference signals and a first pull-up transistor channel connected between a power voltage node and a first output node;

a first pull-down transistor having a first pull-down transistor channel connected between said first output node and a ground voltage node;

a second pull-up transistor having a second pull-up transistor gate receiving said difference signals and a second pull-up transistor channel connected between said power voltage node and a second output node;

a second pull-down transistor having a second pull-down transistor channel connected between said ground voltage node and said second output node;

a resistive path connected between said first output node and said second output node;

a third pull-up transistor having a third pull-up transistor gate connected said first output node and a third pull-up transistor channel connected between said power voltage node and said second output node; and a third pull-down transistor having a third pull-down transistor gate connected to said first output node and a third pull-down transistor channel connected between said ground voltage node and said second output node;

wherein a conductive type of said first pull-up transistor, said second pull-up transistor, and said third pull-down transistor is opposite to a conductive type of said first pull-down transistor, said second pull-down transistor, and said third pull-up transistor.

* * * * *

UNITED STATES PATENT AND TRADEMARK OFFICE
CERTIFICATE OF CORRECTION

PATENT NO. : 5,223,753
DATED : 29 June 1993
INVENTOR(S) : Bang-Won Lee, et al.

It is certified that error appears in the above-indentified patent and that said Letters Patent is hereby corrected as shown below:

Column 1,

Line 14,    change "invert" to --inverted--; and

Line 18,    change "Specially" to --Specifically--.

Signed and Sealed this

Sixteenth Day of August, 1994

Attest:

BRUCE LEHMAN

*Attesting Officer*    *Commissioner of Patents and Trademarks*